(12) United States Patent
Haba et al.

(10) Patent No.: US 12,543,568 B2
(45) Date of Patent: Feb. 3, 2026

(54) THERMOELECTRIC COOLING FOR DIE PACKAGES

(71) Applicant: ADEIA SEMICONDUCTOR BONDING TECHNOLOGIES INC., San Jose, CA (US)

(72) Inventors: Belgacem Haba, Saratoga, CA (US); Rajesh Katkar, Milpitas, CA (US); Patrick Variot, Los Gatos, CA (US); Hong Shen, Palo Alto, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 329 days.

(21) Appl. No.: 18/067,655

(22) Filed: Dec. 16, 2022

(65) Prior Publication Data

US 2023/0197559 A1   Jun. 22, 2023

Related U.S. Application Data

(60) Provisional application No. 63/265,765, filed on Dec. 20, 2021.

(51) Int. Cl.
*H01L 23/38* (2006.01)
*H01L 23/367* (2006.01)
*H01L 25/065* (2023.01)

(52) U.S. Cl.
CPC .......... *H01L 23/38* (2013.01); *H01L 23/3672* (2013.01); *H01L 25/0655* (2013.01); *H01L 25/0657* (2013.01)

(58) Field of Classification Search
CPC . H01L 23/38; H01L 23/3672; H01L 25/0655; H01L 25/0657; H01L 25/0652;

(Continued)

(56) References Cited

U.S. PATENT DOCUMENTS 5,753,536 A    5/1998  Sugiyama et al.
5,771,555 A    6/1998  Eda et al.

(Continued)

FOREIGN PATENT DOCUMENTS

CN    111324021 A  *  6/2020
CN    112103252 A  * 12/2020    ......... H01L 21/4857

(Continued)

OTHER PUBLICATIONS

Kim Kun-Ho; Choo Seung-Yoon, "Photoresist stripping equipment and wafer processing method", Jun. 23, 2020, Xia Tai Xin Semiconductor Qing Dao Ltd, Entire Document (Translation of CN 111324021). (Year: 2020).*

(Continued)

*Primary Examiner* — Stephen S Sul
(74) *Attorney, Agent, or Firm* — Knobbe, Martens, Olson & Bear, LLP

(57) ABSTRACT

In some aspects, the disclosed technology provides microelectronic devices which can effectively dissipate heat and methods of forming the disclosed microelectronic devices. In some embodiments, a disclosed device may include a first integrated device die. The disclosed device may further include a thermoelectric element bonded to the first integrated device die. The disclosed device may further include a heat sink disposed over at least the thermoelectric element. The thermoelectric element may be configured to transfer heat from the first integrated device die to the heat sink. The thermoelectric element directly may be bonded to the first integrated device die without an adhesive.

13 Claims, 10 Drawing Sheets

(58) Field of Classification Search
CPC ........... H01L 24/08; H01L 2225/06589; H01L 23/3677; H01L 23/3731; H01L 23/3738; H01L 23/481; H01L 24/80; H01L 2224/08123; H01L 2224/80896; H10N 10/01; H10N 19/00; H10N 10/10
See application file for complete search history.

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,904,809 | B2 * | 12/2014 | Yuan .................. H10N 10/17 62/3.2 |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,003,004 | B2 * | 6/2018 | Boukai .................. H10N 10/17 |
| 10,026,605 | B2 | 7/2018 | Doub et al. |
| 10,075,657 | B2 | 9/2018 | Fahim et al. |
| 10,170,456 | B2 | 1/2019 | Sung et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,361,141 | B2 | 7/2019 | Jung et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,600,948 | B1 | 3/2020 | Liu |
| 10,707,087 | B2 | 7/2020 | Uzoh et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,296,053 | B2 | 4/2022 | Uzoh et al. |
| 11,329,034 | B2 | 5/2022 | Tao et al. |
| 11,348,898 | B2 | 5/2022 | DeLaCruz et al. |
| 11,355,404 | B2 | 6/2022 | Gao et al. |
| 11,355,443 | B2 | 6/2022 | Huang et al. |
| 11,367,652 | B2 | 6/2022 | Uzoh et al. |
| 11,387,202 | B2 | 7/2022 | Haba et al. |
| 11,515,291 | B2 | 11/2022 | DeLaCruz et al. |
| 2004/0084414 | A1 | 5/2004 | Sakai et al. |
| 2006/0057945 | A1 | 3/2006 | Hsu et al. |
| 2006/0086118 | A1 | 4/2006 | Venkatasubramanian et al. |
| 2007/0111386 | A1 | 5/2007 | Kim et al. |
| 2009/0272417 | A1 | 11/2009 | Schulz-Harder |
| 2010/0079959 | A1 | 4/2010 | Letz |
| 2010/0257871 | A1 * | 10/2010 | Venkatasubramanian ................... H01L 23/38 62/3.7 |
| 2011/0260800 | A1 | 10/2011 | Shanfield et al. |
| 2012/0162947 | A1 | 6/2012 | O'Donnell et al. |
| 2012/0171814 | A1 | 7/2012 | Choi et al. |
| 2014/0175655 | A1 | 6/2014 | Chen et al. |
| 2015/0064498 | A1 | 3/2015 | Tong |
| 2015/0069635 | A1 | 3/2015 | Kim et al. |
| 2016/0343682 | A1 | 11/2016 | Kawasaki |
| 2017/0012194 | A1 | 1/2017 | Wang et al. |
| 2017/0125318 | A1 | 5/2017 | Harr et al. |
| 2017/0194549 | A1 | 7/2017 | Mascolo et al. |
| 2018/0090427 | A1 | 3/2018 | Bernstein et al. |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |
| 2018/0190583 | A1 | 7/2018 | DeLaCruz et al. |
| 2018/0211900 | A1 | 7/2018 | Gutala et al. |

(56) References Cited

U.S. PATENT DOCUMENTS

| | | |
|---|---|---|
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0342438 A1 | 11/2018 | Chen et al. |
| 2019/0006263 A1 | 1/2019 | Yu et al. |
| 2019/0019934 A1* | 1/2019 | Watanabe ............ H10N 10/856 |
| 2019/0096741 A1 | 3/2019 | Uzoh et al. |
| 2019/0103290 A1 | 4/2019 | Medina et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0206836 A1 | 7/2019 | Burton |
| 2019/0265411 A1 | 8/2019 | Huang et al. |
| 2019/0326272 A1 | 10/2019 | Wilkerson et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0058571 A1 | 2/2020 | Wang et al. |
| 2020/0075534 A1 | 3/2020 | Gao et al. |
| 2020/0105639 A1* | 4/2020 | Valavala ................ H10N 10/17 |
| 2020/0118973 A1 | 4/2020 | Wang et al. |
| 2020/0126888 A1 | 4/2020 | Lofgreen et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0294908 A1 | 9/2020 | Haba et al. |
| 2020/0312742 A1 | 10/2020 | Lofgreen et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0371154 A1 | 11/2020 | DeLaCruz et al. |
| 2020/0395321 A1 | 12/2020 | Katkar et al. |
| 2021/0066244 A1 | 3/2021 | Kim et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193548 A1 | 6/2021 | Wan et al. |
| 2021/0193603 A1 | 6/2021 | Katkar et al. |
| 2021/0193620 A1 | 6/2021 | Refai-Ahmed et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0351135 A1 | 11/2021 | Or-Bach et al. |
| 2021/0366820 A1 | 11/2021 | Uzoh |
| 2021/0407941 A1 | 12/2021 | Haba |
| 2021/0407991 A1 | 12/2021 | Or-Bach et al. |
| 2022/0045258 A1 | 2/2022 | Seki et al. |
| 2022/0077063 A1 | 3/2022 | Haba |
| 2022/0077087 A1* | 3/2022 | Haba ...................... H01L 24/08 |
| 2022/0093484 A1 | 3/2022 | Herrault et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0415743 A1* | 12/2022 | Eid ..................... H01L 25/0657 |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |
| 2025/0273517 A1 | 8/2025 | Lee et al. |

FOREIGN PATENT DOCUMENTS

| | | |
|---|---|---|
| CN | 112823430 A | 5/2021 |
| CN | 113284864 A | 8/2021 |
| CN | 111128976 B | 10/2021 |
| CN | 113594154 A | 11/2021 |
| JP | 2013-033786 A | 2/2013 |
| JP | 2018-160519 | 10/2018 |
| WO | WO 2005/043584 A2 | 5/2005 |

(56) References Cited

FOREIGN PATENT DOCUMENTS

| WO | WO 2014/159572 A1 | 10/2014 |
|----|-------------------|---------|
| WO | WO 2020/054205 A1 | 3/2020  |
| WO | WO 2021/234849 A1 | 11/2021 |

OTHER PUBLICATIONS

Wang Bin et al., "Refrigeration type LTCC micro-system based on metal micro-channels and preparation method of refrigeration type LTCC micro-system", Dec. 18, 2020, Univ Xidian, Entire Document (Translation of CN 112103252). (Year: 2020).*

International Search Report and Written Opinion mailed Apr. 26, 2023, in International Application No. PCT/US2022/081849, 14 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820."

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

Aliabadi et al., "Simulation of cascaded thermoelectric devices for cryogenic medical treatment". Excerpt Proceedings 2014 COMSOL Conference in Cambridge, U.K., 4 pages.

García-Cañadas et al., "Low frequency impedance spectroscopy analysis of thermoelectric modules". J Electronic Mater. Jun. 2014;43(6): 2411-2414.

Iceqube, "Thermoelectrics/Peltier effect described". (Oct. 25, 2020) Downloaded from https://web.archive.org/web/20201025045424/https://iceqube.cm/technical/thermoelectrics-peltier-effect-described/ ; 3 pages.

Officina Turini. "2.0 Basic Principles of Thermoelectric Modules & Materials", (Sep. 19, 2020); downloaded from https://web-archive.org/web/20200919121017/https://www.officinaturini.com/2.0-basic-principles.html; 2 pages.

Thermoelectrics Northwestern Materials Science and Engineering. "Thermoelectrics at NU-MSE". (Feb. 4, 2020) Downloaded from https://web.archive.org/web/20200204062005/http://thermoelectrics.matsci.northwestern.edu/thermoelectrics/engneering.html; 9 pages.

European Extended Search Report dated Oct. 23, 2025, in Application No. 22912608.1, 9 pages.

\* cited by examiner

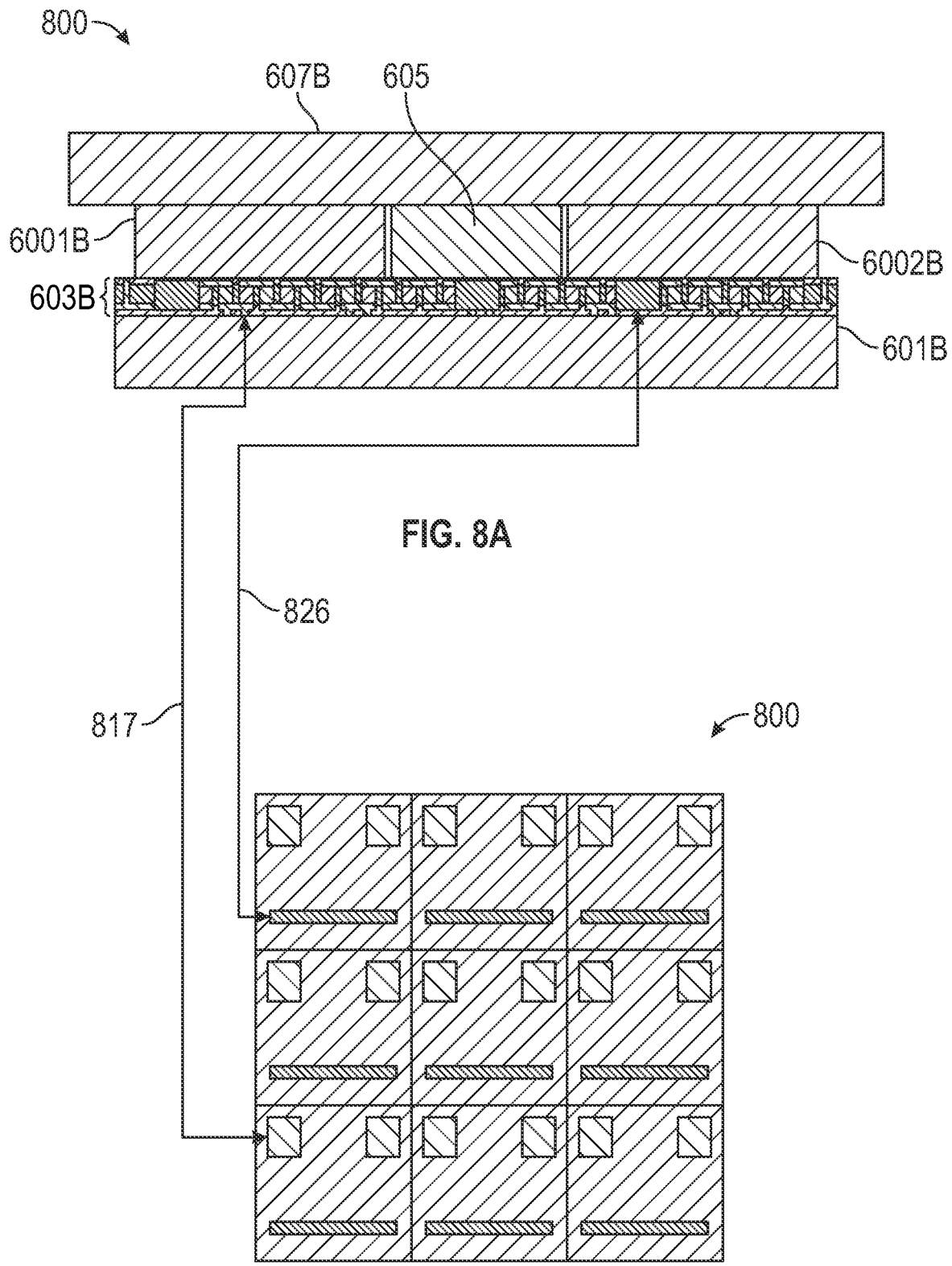

THERMOELECTRIC COOLING FOR DIE PACKAGES

CROSS-REFERENCE TO RELATED APPLICATIONS

This application claims priority to U.S. Provisional Application No. 63/265,765, filed Dec. 20, 2021, titled "THERMOELECTRIC COOLING FOR DIE PACKAGES", the content of which is incorporated by reference in its entirety.

BACKGROUND

Field

The field relates to dissipating heat in microelectronics, and particularly in microelectronic devices including directly bonded elements.

Description of the Related Art

With the miniaturization and the high density integration of electronic components, the heat flux density in microelectronics is increasing. The microelectronic components are typically operated below certain rated temperature to ensure optimal operation. A heat spreader or heat sink may be mounted using thermal interface material (TIM) on top of the hot microelectronic component or semiconductor die to extract heat from the top of the die. If the heat generated during the operation of microelectronics is not dissipated or extracted enough, the microelectronics may not operate reliably, its performance may be affected, and it may even shut down or burn out. In particular, thermal dissipation and extraction is a serious problem in high-power devices, and the problem worsens with chip stacking.

BRIEF DESCRIPTION OF THE DRAWINGS

Specific implementations will now be described with reference to the following drawings, which are provided by way of example, and not limitation.

FIG. 6A-2 schematically illustrates a plan view of the example microelectronic system shown in FIG. 6A.

FIG. 8A schematically illustrates a cross-sectional view of yet another example microelectronic system. FIG. 8B schematically illustrates a plan view of the example microelectronic system shown in FIG. 8A.

DETAILED DESCRIPTION

Microelectronic elements (e.g., dies/chips) can be stacked and bonded to one another to form a device. It is difficult to dissipate heat in a device with chip stacking, especially as chips get thinner. The use of chip joining methods, such as adhesive bonding, flip chip interconnections, etc., can make heat dissipation or transfer towards the heat spreader and eventual extraction in the device less effective, as the adhesives may reduce or insulate heat transfer from one die to another or from bottom die towards the top die (towards the direction of the heat spreader). Moreover, it is difficult to specifically lower the temperature in a desired portion of the device. For example, when packaging stacks of dies, heat dissipation is typically aided by heat sinks at the top of the stack, but efficiently extracting heat from lower dies in the die stack (especially the lowest die of a stack) is challenging. Accordingly, there remains a continuing need for improved techniques to dissipate heat in microelectronic devices.

Figure 1A:
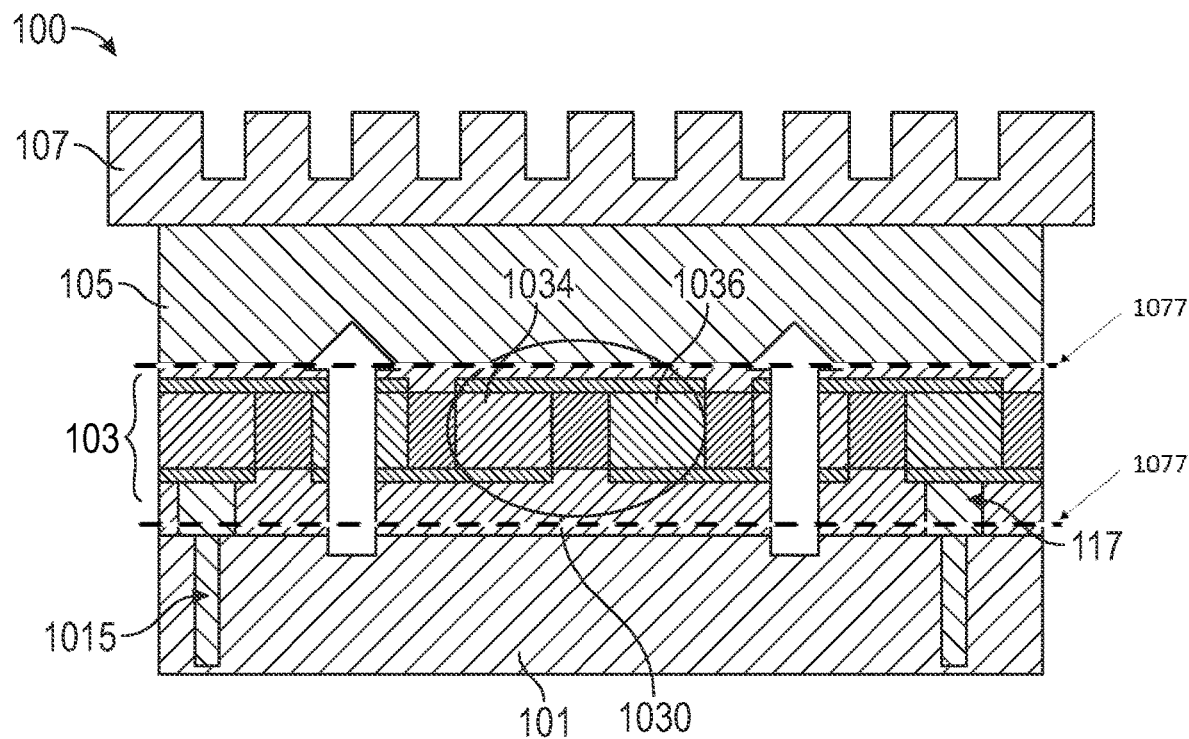
FIG. 1A schematically illustrates a cross-sectional view of an example microelectronic system.

Methods and structures are provided for redirecting thermal flows in die stacks, for example from lower dies in a stack to upper heat dissipation structures (e.g., heat sinks/heat pipes). Also provided are processes for forming such structures. In an aspect, as shown in FIG. 1A, a microelectronic device 100 may include a thermoelectric element 103 which can help remove heat from the device 100 and actively redirect the heat flow within the device 100, for example actively lower the temperature of a certain chip in the device 100, of a certain location of a chip or of a certain hot spot in a chip. The thermoelectric element 103 may comprise a Peltier element which includes two materials with different Peltier coefficients joined together at a junction. The Peltier element may utilize the Peltier effect to create a net heat flux at the junction of the two different materials when supplied with electrical energy (e.g., a DC electric current), due to the imbalance of the Peltier heat flowing in and out of the junction. In some embodiments, The Peltier element may include a plurality of pairs 1030 of p-type and n-type semiconductor pellets or chips, etc. connected electrically in series and thermally in parallel, such as in the configuration shown in FIG. 1A. In this configuration, the charge carriers and heat may all flow in the same direction through the pellets 1034 and 1036 (bottom to top, or top to bottom, depending on the applied voltage bias). For example, in FIG. 1A, the pellets 1034 and 1036 can be biased such that heat flux flows upwardly, as indicated by the arrows, from the lower active chip 101 through the Peltier element and the carrier element 105 to the heat sink 107.

In some embodiments, the thermoelectric element 103 is not bonded to other elements of the device 100 by an adhesive or thermal interface material (TIM), which may interfere with heat transfer. Rather, the thermoelectric element 103 may be directly bonded to another element in the device 100, thus improving heat transfer efficiency. For example, a plurality of p-type and n-type semiconductor pellet pairs 1030 or a structure (e.g., a wafer, die, etc.) comprising a plurality of p-type and n-type semiconductor pellet pairs 1030 may be directly bonded to an active chip 101. In other embodiments, the thermoelectric element 103 may be grown onto an active chip 101 or die. An active chip 101 may be a die comprising active circuitry, e.g., the active circuitry can include one or more transistors.

In some embodiments, a plurality of p-type and n-type semiconductor thermoelectric pellet pairs 1030 can be divided into many groups, and each group may be controlled independently. For example, a sensor (e.g., diode) may be used to measure the temperature at a location in the device 100. If the temperature at that location is higher than a threshold or optimal operating temperature of the device 100, the group of thermoelectric pellet pairs 1030 associated with that location may be activated by applying an electrical current through one or more pairs of electrical contact pins/pads 117. Thus, the temperature in a device 100 may be locally monitored and controlled. The ability to independently operate each or a selected group of thermoelectric pellet pairs 1030 may also allow the thermoelectric element to consume less power.

FIG. 1A schematically illustrates a cross-sectional view of an example microelectronic system 100 having stacked semiconductor elements (e.g., dies/chips/carriers) and a thermoelectric element 103 which may direct heat to a heat sink 107 (e.g., a metal heat sink or a heat pipe with fluid coolant) at the top of the stack. The heat generated by a lower semiconductor element 101 (e.g., an active chip) during operation may be actively transferred to the heat sink 107 by the thermoelectric element 103 and dissipated away from the system 100, as indicated by the arrows. In some embodiments, the thermoelectric element 103 may be bonded to an element (e.g., a lower active chip 101 or an upper carrier 105) at bonding interfaces 1077 by way of direct bonding without an intervening adhesive, such as hybrid direct bonding processes described below and commercially available from Adeia of San Jose, CA. In some embodiments, the thermoelectric element 103 may be bonded to the lower active chip 101 in a F2F (face-to-face) or F2B (face-to-back) configuration. In some embodiments, electrical contacts 117 of thermoelectric element 103 may be connected directly or via conductive traces to TSVs (through-substrate vias) 1015 extending in the element 101 for powering of the thermoelectric element. For example, the electrical contacts 117 of thermoelectric element 103 may be directly bonded to the TSVs 1015 in the element 101. In other embodiments, the thermoelectric element 103 may be grown on the lower active chip 101.

Figure 1B:
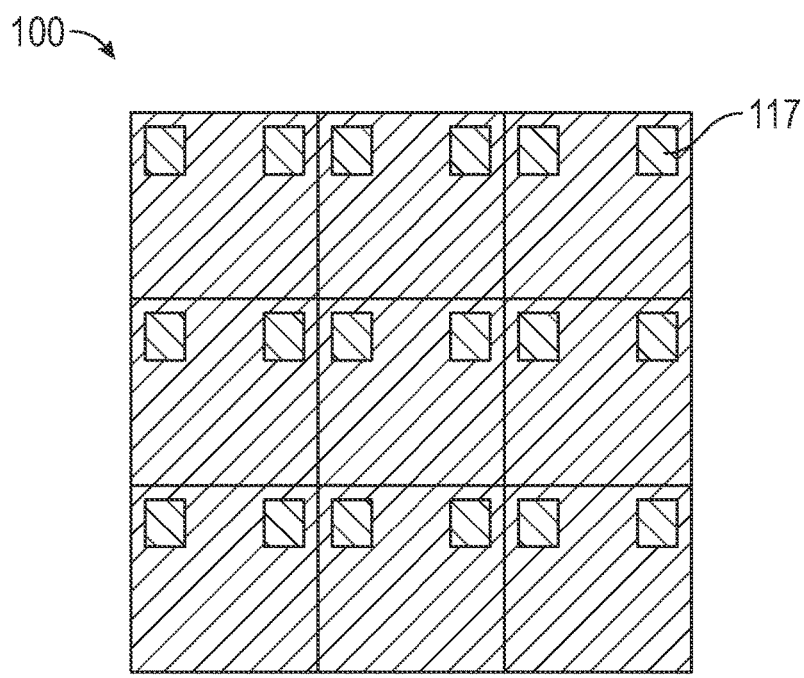
FIG. 1B schematically illustrates a plan view of the example microelectronic system shown in FIG. 1A.

FIG. 1B schematically illustrates a plan view of the example microelectronic system 100 shown in FIG. 1A. The thermoelectric element 103 may be configured for zoned control of cooling the lower active chip 101. As shown in FIG. 1B, as an example, a plurality of electrical contacts 117 are used for multi-zonal control/positional control of different groups of thermoelectric pellet pairs 1030 in the thermoelectric element 103 during cooling operation, providing local thermal dissipation in response to measured hot spot distribution. In various embodiments, signals measured by temperature sensors may be used to control the thermoelectric element 103, and the temperature sensors may be located in the lower active chip 101 or within the thermoelectric element 103. In various embodiments, control of the thermoelectric element 103 may be done by the lower active chip 101, within the thermoelectric element 103, or by an external chip on the system board.

Figure 2A:
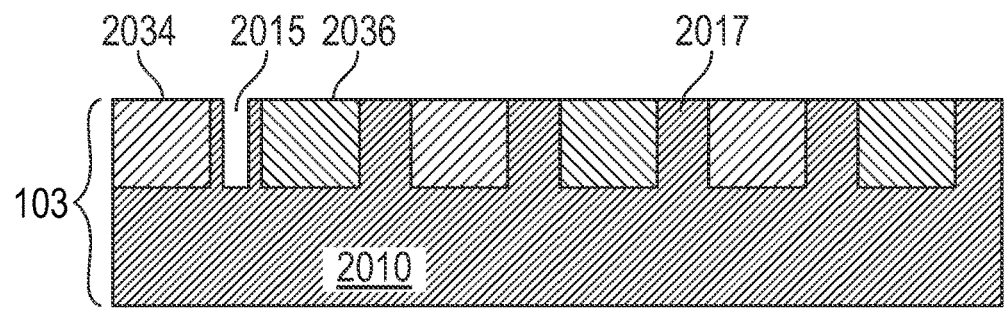
FIGS. 2A-2F schematically illustrate a method of forming a thermoelectric element in a die stack according to an embodiment of the disclosed technology.
Figure 2B:
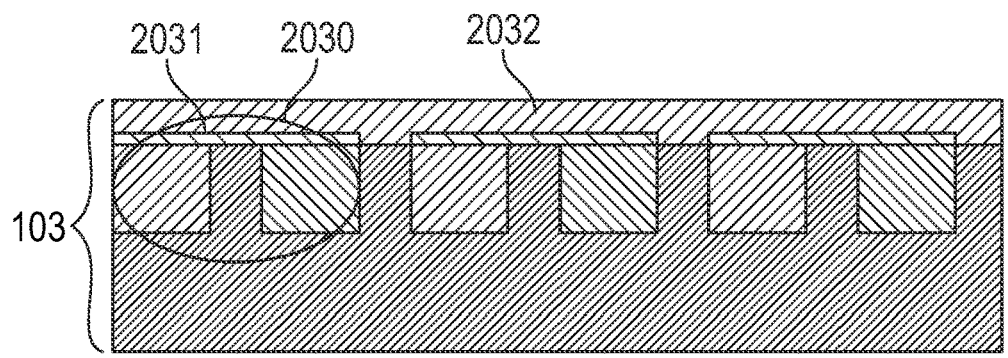
Figure 2C:
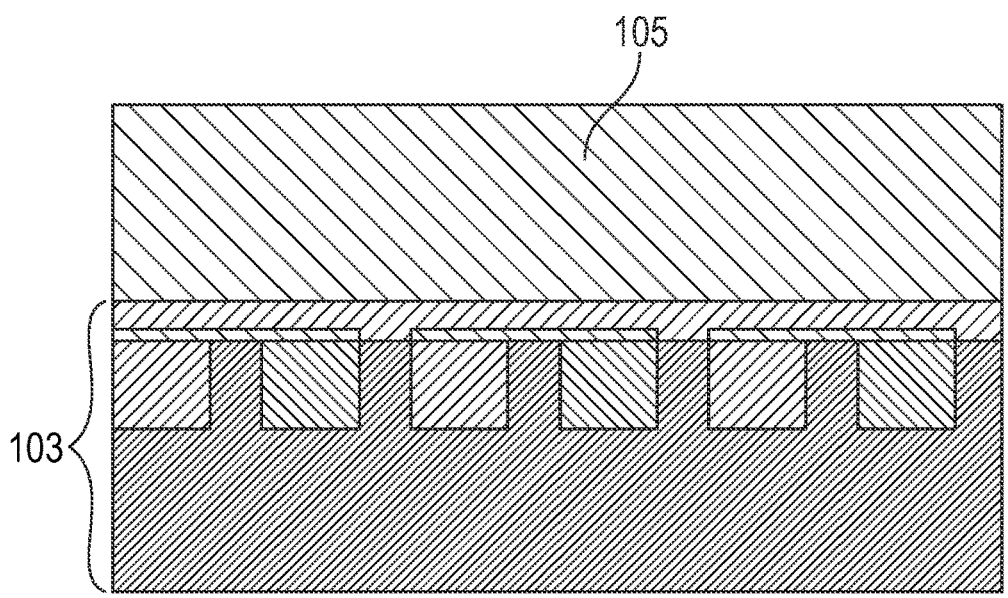
Figure 2D:
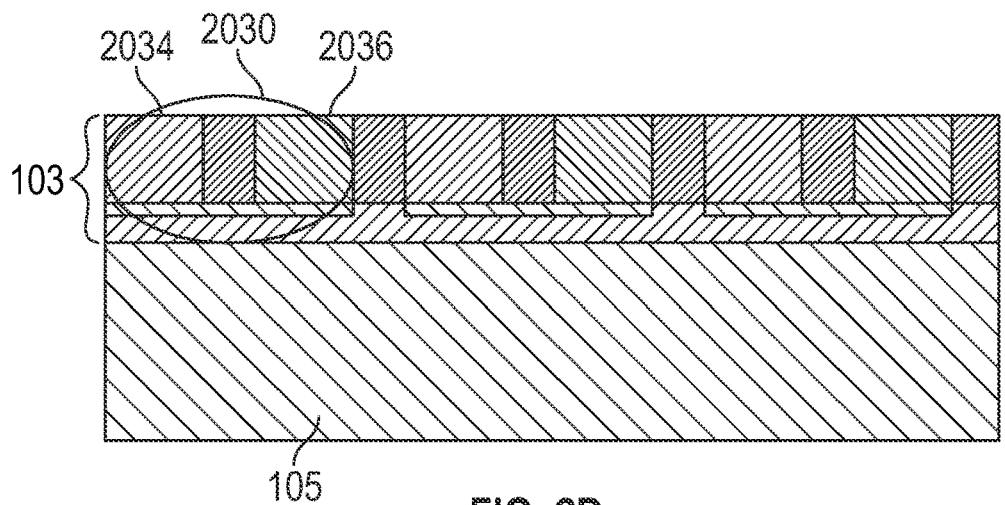
Figure 2E:
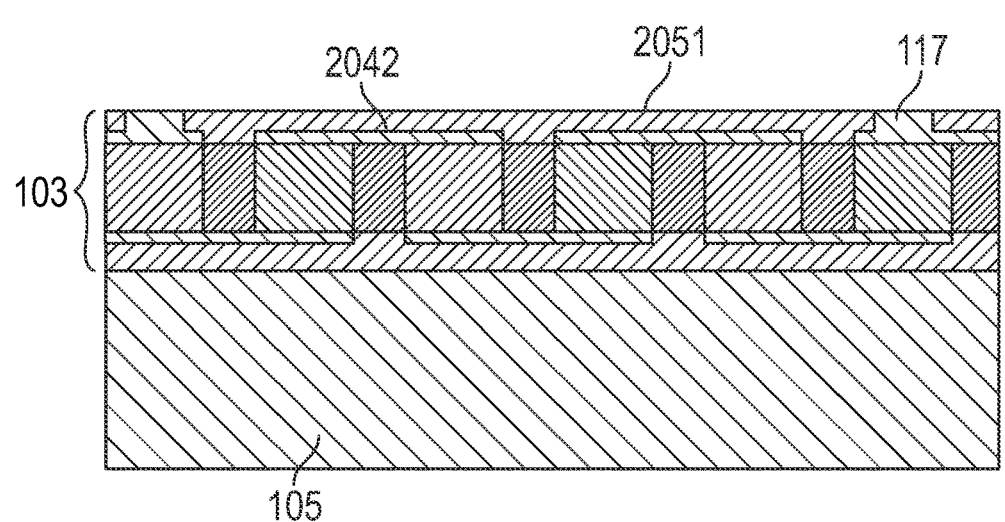
Figure 2F:
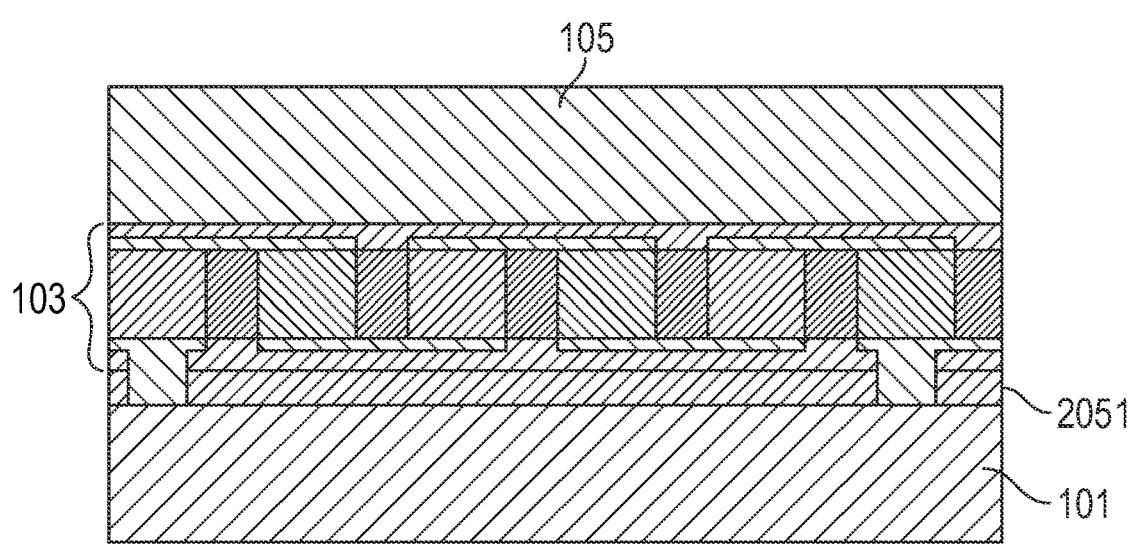

FIGS. 2A-2F schematically illustrates a method of forming a thermoelectric element 103 in a die stack. FIG. 2A shows a first step including forming N- or P-doped regions (2034 and 2036, respectively) in a suitable thermoelectric substrate 2010 (e.g., a $Bi_2Te_3$ wafer), where the N- or P-doped regions are separated by physical gaps 2015 or wide (e.g. >1 μm) intrinsic regions 2017. The physical gap 2015 may be filled with one or more suitable organic or inorganic dielectric materials. The widths of P or N regions (2036 or 2034) may vary from tens of μm to several mm in one or both planar directions. FIG. 2B shows a second step including dielectric deposition, and then metallization to form connected N/P pairs 2030. The metallization may be one or more conductive traces 2031 between each P and N regions (2036 and 2034, respectively). In some embodiments, another metallization may also be formed to act as a hot or cold plate. For large widths of P and N regions, several conductive traces 2031 may be implemented for uniform carrier flow/distribution effectively creating uniform thermal gradient between hot and cold plates. In other embodiments, metallization layers connecting P and N regions (2036 and 2034, respectively) is followed by dielectric 2032 deposition. The dielectric layer 2032 is prepared (e.g., cleaning, chemical-mechanical polishing or CMP, plasma activation, etc.) for direct bonding (e.g., by direct insulator-to-insulator bonds or by direct hybrid bonds). FIG. 2C shows a third step including attaching the formed thermoelectric element 103 to a carrier 105 (e.g., by way of dielectric-to-dielectric direct bonding, such as ZIBOND®, commercially available from Adeia). The carrier 105 may be a permanent carrier that is not subsequently removed and may be formed of a suitable good thermally conductive material (e.g., Si, ceramic, Aluminum, Aluminum Nitride, Silicon Carbide, etc., or a material having a thermal conductivity greater than 1 W/cm/° C.). In other embodiments, during later processing the carrier 105 may be removed. FIG. 2D shows a fourth step including grinding or polishing or any other suitable process to remove the thermoelectric substrate 2010 (e.g., the $Bi_2Te_3$ wafer) and reveal the N/P pairs 2030. FIG. 2E shows a fifth step including dielectric 2042 deposition, metallization to create electrical contacts 117, and forming a bonding layer 2051 (e.g., a layer configured for hybrid bonding such as DBI® bonding commercially available from Adeia). FIG. 2F shows a sixth step including attaching (e.g., by direct hybrid bonding) the thermoelectric element 103 to an active chip 101 or wafer (face-to-face, F2F, or face-to-back, F2B), which may include TSVs. In other embodiments, the thermoelectric element 103 is direct bonded to an active chip 101 or wafer without electrical connections between them. The method described in connection with FIGS. 2A-2F may be utilized to manufacture the devices and systems, and/or to operate in conjunction with the devices and systems, that are described in U.S. Provisional Application No. 63/265,770, filed Dec. 20, 2021, titled "THERMOELECTRIC COOLING IN MICROELECTRONICS", the content of which is incorporated herein by reference.

Figure 3A:
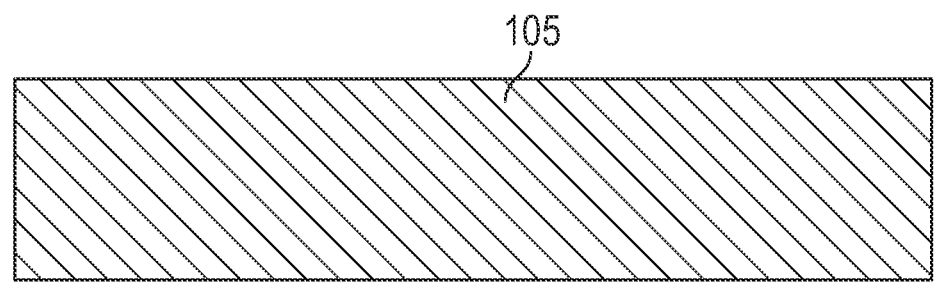
FIGS. 3A-3C schematically illustrate a portion of another method of forming a thermoelectric element in a die stack according to an embodiment of the disclosed technology.
Figure 3B:
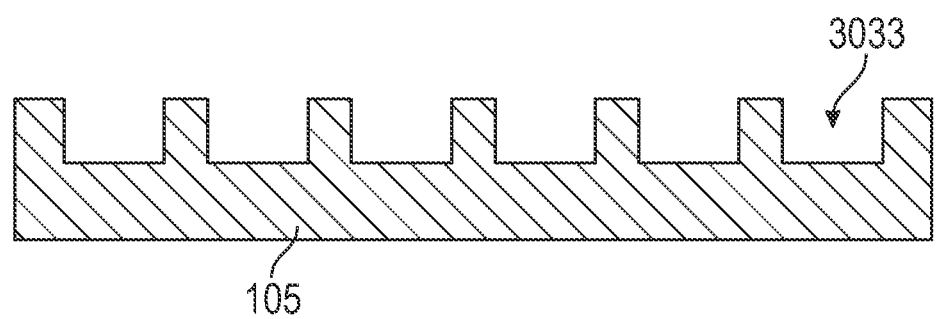
Figure 3C:
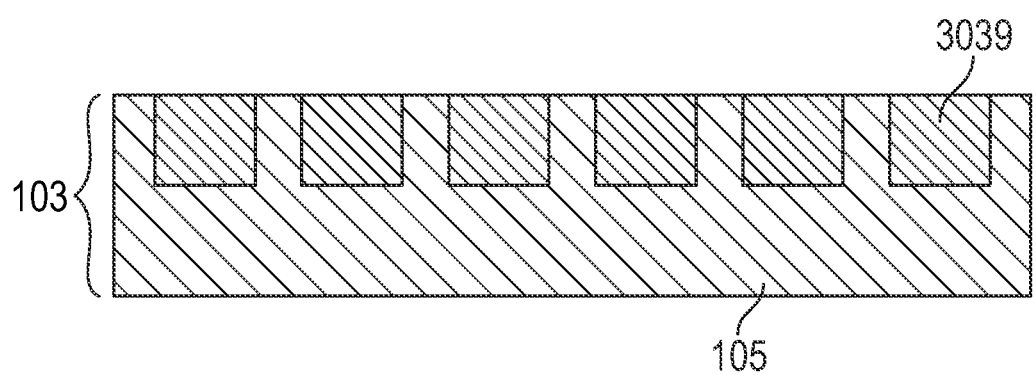

FIGS. 3A-3C schematically illustrates a portion of another method of forming a thermoelectric element 103 in a die stack. FIG. 3A shows starting from a carrier wafer 105 (which may have a high thermal conductivity, e.g., a thermal conductivity greater than 1 W/cm/° C.). In some examples, the material may be Si or ceramic, if used as a permanent carrier. Other carrier materials like Aluminum, Aluminum Nitride, Silicon Carbide, may be used in some examples. FIG. 3B shows subsequently forming small cavities 3033 in the wafer 105 (with or without also depositing a layer of dielectric/insulator in the cavity 3033). FIG. 3C shows subsequently filling the cavities with Bi and Te mix 3039, followed by high temp sintering. Alternatively, $Bi_2Te_3$ (doped) wafer is crushed and the powder is compressed into the cavities/pockets and sintered. Alternatively, the cavities 3033 may be filled by deposition, stenciling or 3D printing of the doped materials 3039 in them. Next, the method may proceed with the steps as described in connection with FIGS. 2B-2F. The method described in connection with FIGS. 3A-3C may be utilized to manufacture the devices and systems, and/or to operate in conjunction with the devices and systems, that are described in U.S. Provisional Application No. 63/265,770, filed Dec. 20, 2021, titled "THERMOELECTRIC COOLING IN MICROELECTRONICS", the content of which is incorporated herein by reference.

Figure 4A:
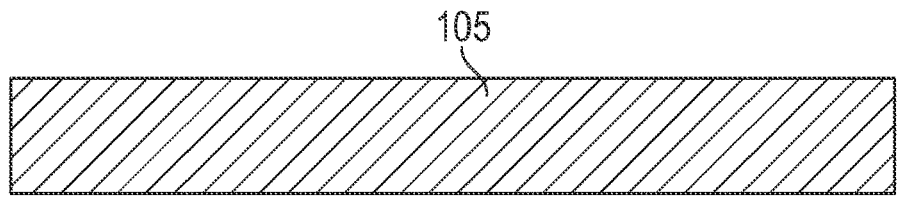
FIGS. 4A-4D schematically illustrate yet another method of forming a thermoelectric element in a die stack according to an embodiment of the disclosed technology.
Figure 4B:
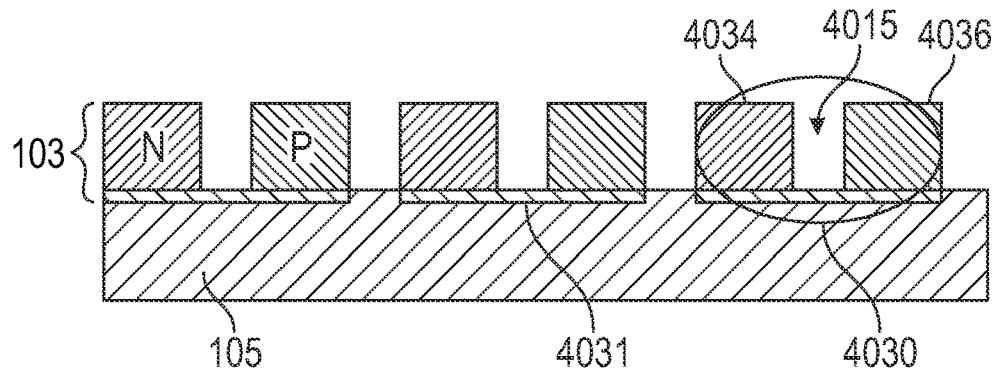
Figure 4C:
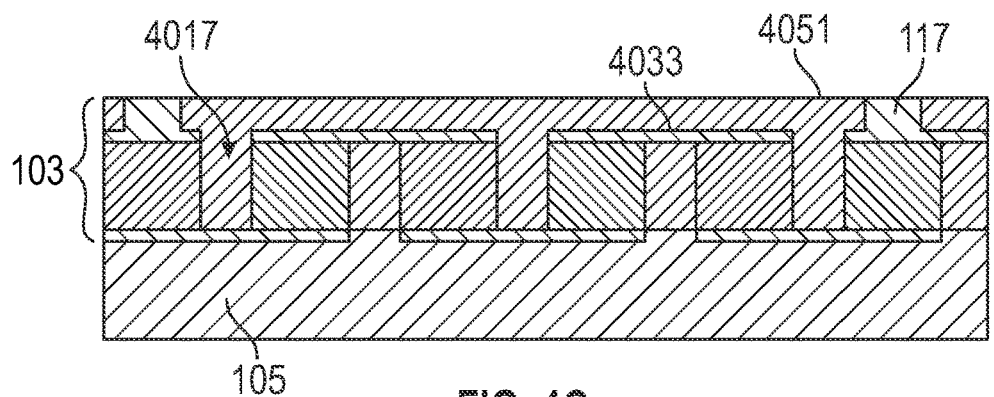
Figure 4D:
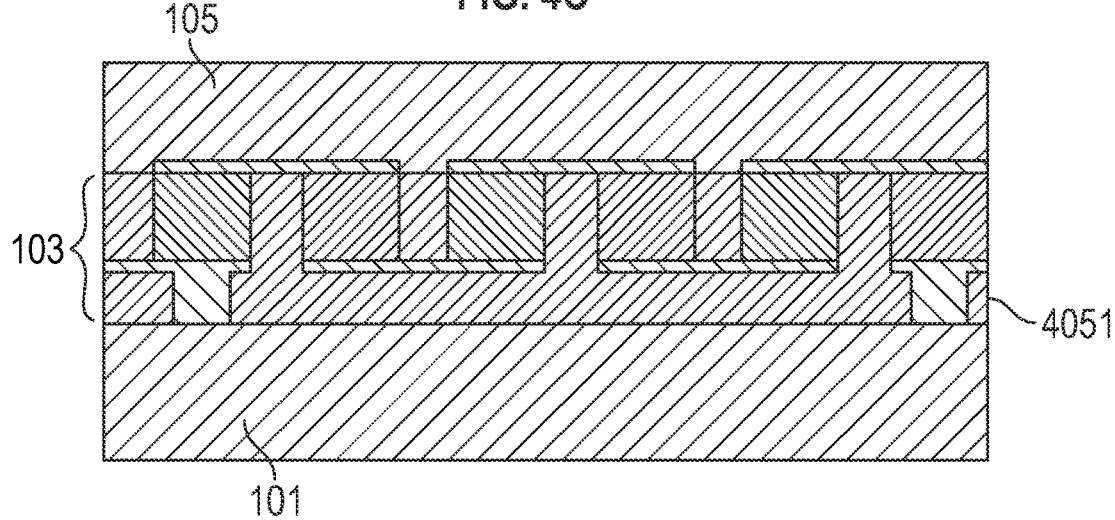

FIGS. 4A-4D schematically illustrates yet another method of forming a thermoelectric element 103 in a die stack. FIG. 4A shows a first step including starting with a carrier 105 (or interposer). FIG. 4B shows a second step including metallization to create electrical connections 4031, then depositing, stenciling, or 3D printing doped $Bi_2Te_3$ onto the carrier 105 to form features/pellets 4034 and 4036 that will become thermoelectric N/P pairs 4030. FIG. 4C shows a third step including filling the gaps 4015 between the $Bi_2Te_3$ features with dielectric 4017, metallization to create electrical connections 4033 and contacts 117, and forming a bonding layer 4051 (e.g., a layer configured for direct hybrid bonding, such as DBI® bonding, available commercially from Adeia). FIG. 4D shows a fourth step including attaching (e.g., by direct hybrid bonding) the formed thermoelectric element 103 to an active chip 101 or wafer (F2F or F2B), which may include TSVs. In other embodiments, the thermoelectric element 103 is direct bonded to an active chip 101 or wafer without electrical connections between them. In some embodiments, the thermoelectric element 103 may span a region of about 1-3 mm in size. The pitch for the N-P pairs 4030 may be about 0.5 mm to several mm, or may be about tens of microns. In some embodiments, the pitch for the N-P pairs 4030 may be about 0.1 mm, 0.5 mm, 1 mm, 2 mm, 3 mm, 4 mm, 5 mm or therebetween, or may be about 10 microns, 30 microns, 50 microns, 70 microns, 90 microns or therebetween. The method described in connection with FIGS. 4A-4D may be utilized to manufacture the devices and systems, and/or to operate in conjunction with the devices and systems, that are described in U.S. Provisional Application No. 63/265,770, filed Dec. 20, 2021, titled "THERMOELECTRIC COOLING IN MICROELECTRONICS", the content of which is incorporated herein by reference.

Figure 5A:
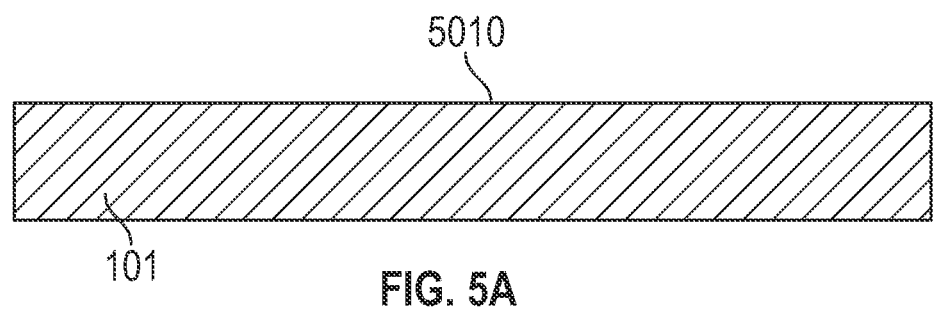
FIGS. 5A-5C schematically illustrate still another method of forming a thermoelectric element in a die stack according to an embodiment of the disclosed technology.
Figure 5B:
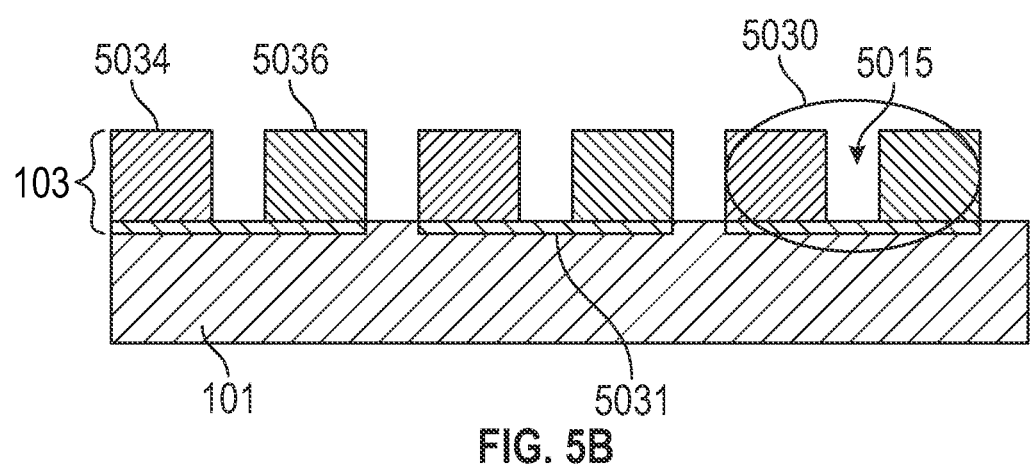
Figure 5C:
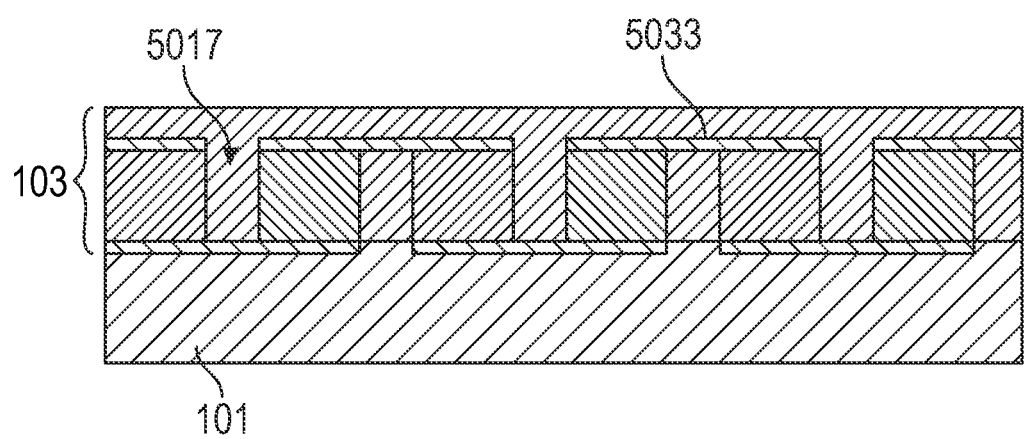

FIGS. 5A-5C schematically illustrates still another method of forming a thermoelectric element 103 in a die stack by directly growing the thermoelectric element 103 on an active wafer/chip 101. FIG. 5A shows a first step including starting with an active wafer/chip 101. FIG. 5B shows a second step including metallization to create electrical connections 5031, then deposition/stenciling/3D printing doped $Bi_2Te_3$ onto the backside 5010 of the active wafer/chip 101 to form pellets 5034 and 5036 that will become thermoelectric N/P pairs 5030. FIG. 5C shows a third step including filling the gaps 5015 between the $Bi_2Te_3$ features with dielectric 5017, and metallization to create electrical connections 5033. In some embodiments, the thermoelectric element 103 may span a region of about 0.5-3 mm in size. The pitch for the N-P pairs 5030 may be about 0.5-1 mm, or may be about tens of microns. In some embodiments, the pitch for the N-P pairs 4030 may be about 0.1 mm, 0.5 mm, 1 mm, 2 mm, 3 mm, 4 mm, 5 mm or therebetween, or may be about 10 microns, 30 microns, 50 microns, 70 microns, 90 microns or therebetween. The method described in connection with FIGS. 5A-5C may be utilized to manufacture the devices and systems, and/or to operate in conjunction with the devices and systems, that are described in U.S. Provisional Application No. 63/265,770, filed Dec. 20, 2021, titled "THERMOELECTRIC COOLING IN MICROELECTRONICS", the content of which is incorporated herein by reference.

Figure 6A:
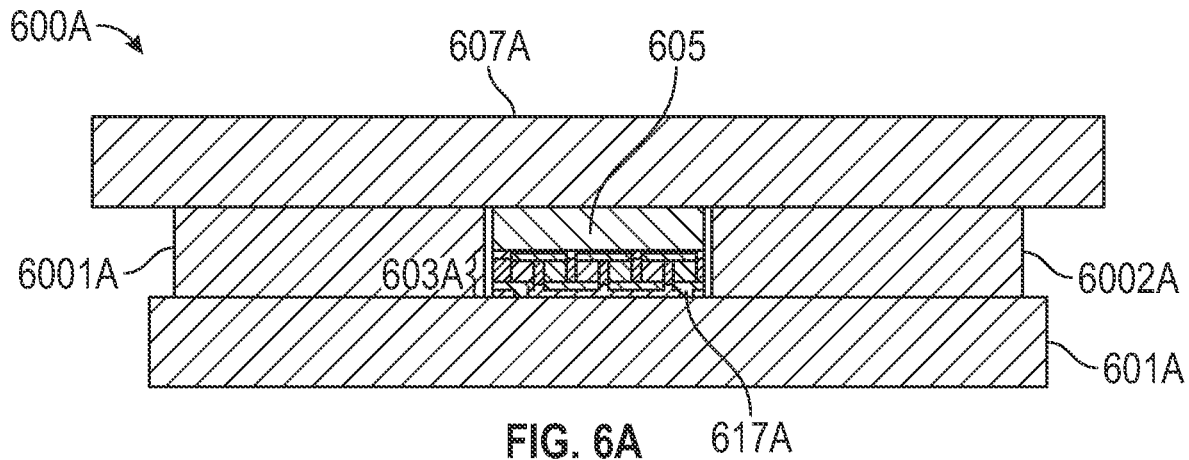
FIG. 6A schematically illustrates a cross-sectional view of another example microelectronic system.
Figure 6B:
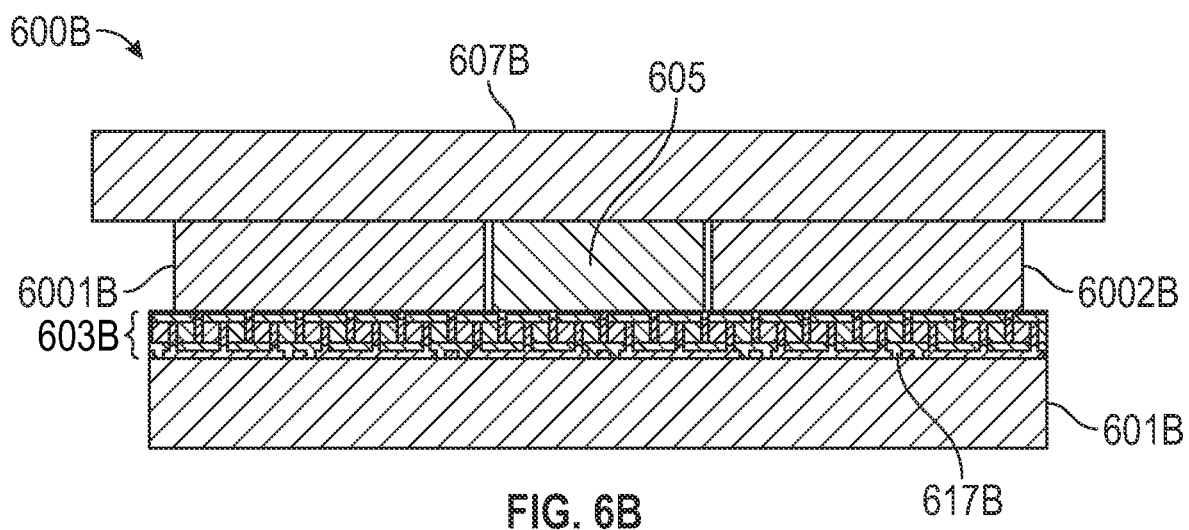
FIG. 6B schematically illustrates a cross-sectional view of yet another example microelectronic system.
Figures 2, 6A:
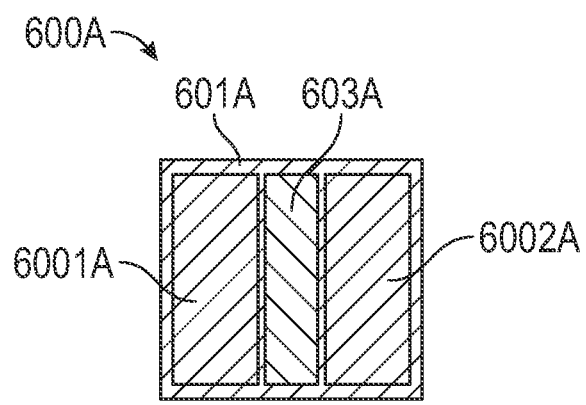

FIG. 6A schematically illustrates a cross-sectional view of an example microelectronic system 600A having stacked semiconductor elements (e.g., carrier element 605 and active dies 601A, 6001A and 6002A) and a thermoelectric element 603A which directs heat from a bottom chip (601A) to a heat sink 607A at the top of the stack. The thermoelectric element 603A and a plurality of chips (e.g., 6001A and 6002A) may be mounted on the bottom chip (601A). The thermoelectric element 603A may be direct bonded (e.g., by way of insulator-to-insulator direct bonding or by hybrid direct bonding) to the bottom chip 601A. The thermoelectric element 603A may be adjacent to at least one chip (e.g., at least 6001A and/or 6002A) and thus reducing heat flow through the at least one chip 6001A and/or 6002A. The thermoelectric element 603A may be powered by electrical contacts 617A connecting to the bottom chip 601A. FIG. 6A-2 schematically illustrates a plan view of the example microelectronic system 600A shown in FIG. 6A. FIG. 6B schematically illustrates a cross-sectional view of another example microelectronic system 600B having stacked semiconductor elements (e.g., carrier element 605 and active dies 601B, 6001B and 6002B) and a thermoelectric element 603B which directs heat from a bottom chip (601B) to a heat sink 607B at the top of the stack. The thermoelectric element may be mounted on the bottom chip (601B), and a plurality of chips (e.g., 6001B and 6002B) may be mounted on the thermoelectric element 603B. The thermoelectric element 603B may be powered and controlled via electrical contacts 617B connecting to the bottom chip (601B) in response to temperature detection by sensors disposed in any of the neighboring chips (e.g., 601B, 6001B or 6002B).

Figure 7A:
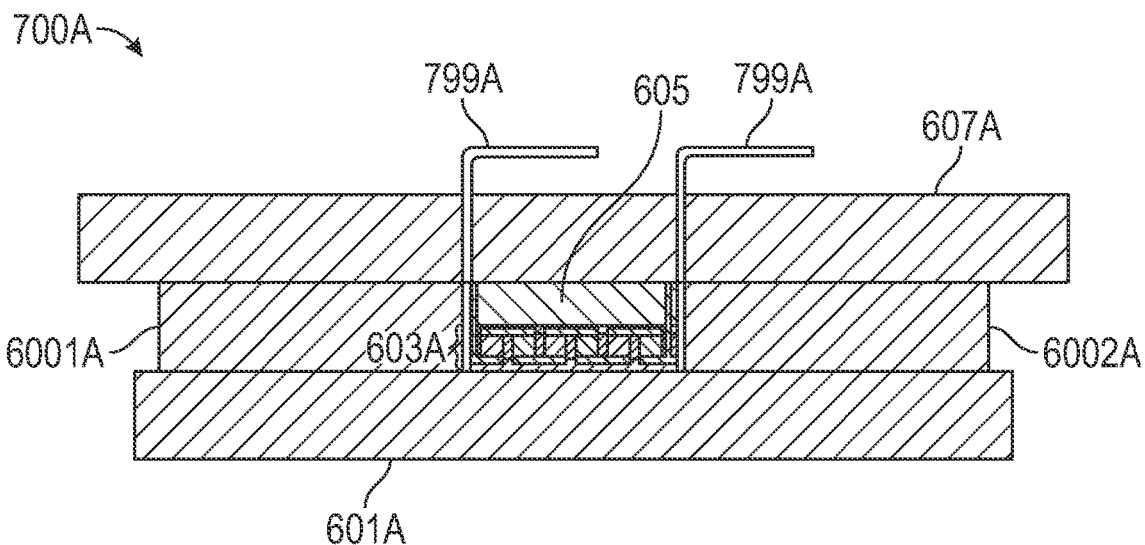
FIG. 7A schematically illustrates a cross-sectional view of yet another example microelectronic system.
Figure 7B:
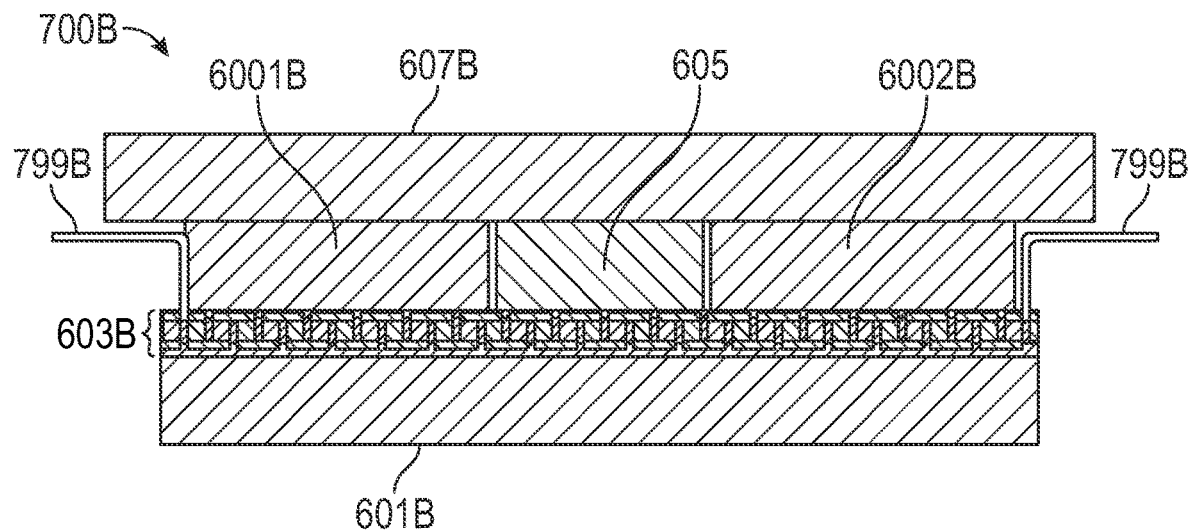
FIG. 7B schematically illustrates a cross-sectional view of yet another example microelectronic system.

FIG. 7A schematically illustrates a cross-sectional view of an example microelectronic system 700A similar to that shown in FIG. 6A, where like features are referenced by like reference numbers, but using bondwires 799A to power the thermoelectric element 603A from the backside. The thermoelectric element 603A may be direct bonded (e.g., by direct hybrid bonding or by insulator-to-insulator direct bonding) to the bottom chip 601A. FIG. 7B schematically illustrates a cross-sectional view of an example microelectronic system 700B similar to that shown in FIG. 6B, where like features are referenced by like reference numbers, but using external connections, e.g., bondwires 799B to power the thermoelectric element 603B from the backside. In the embodiments of FIGS. 7A-7B, an external device can control the operation of the thermoelectric element 603A or 603B. For example, a chip or die on the system board (not shown) can control the operation of the thermoelectric element 603A or 603B.

FIG. 8A schematically illustrates a cross-sectional view of an example microelectronic system 800 similar to that shown in FIG. 6B, where like features are referenced by like reference numbers, but additionally or alternatively has temperature sensors 826 embedded in the thermoelectric element 603B to control the temperature distribution and chip activities. For example, as the sensors 826 detect a temperature, the sensors 826 will send a signal to circuitry in die 601B, 6001B and/or 6002B, and the die 601B, 6001B and/or 6002B can send a control signal to the thermoelectric element 603B. FIG. 8B schematically illustrates a plan view of the example microelectronic system 800 shown in FIG. 8A, showing that each group of thermoelectric N/P pellets is monitored by a temperature sensor 826 and powered by a pair of electrical contacts 817.

Figure 9:
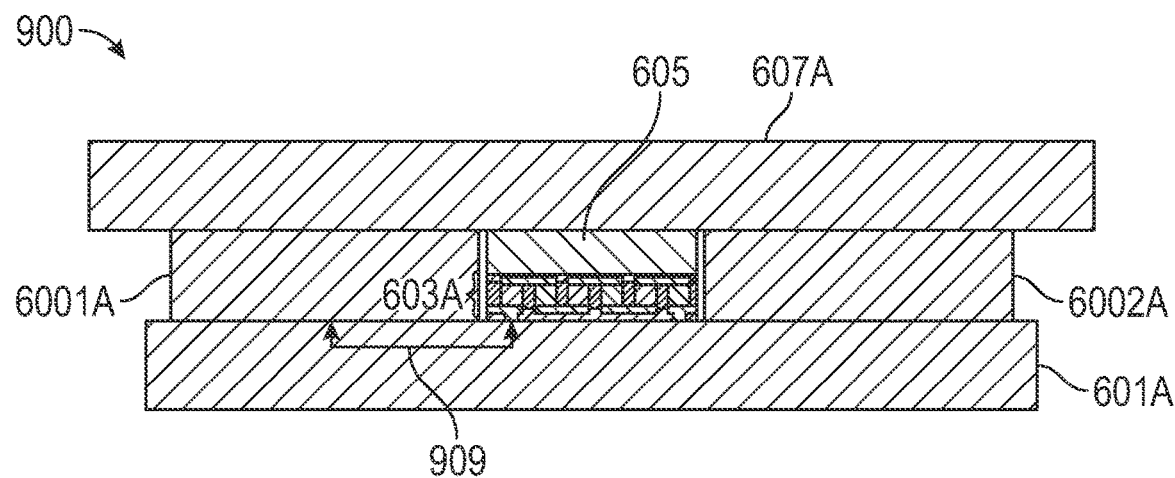
FIG. 9 schematically illustrates a cross-sectional view of yet another example microelectronic system.

FIG. 9 schematically illustrates a cross-sectional view of an example microelectronic system 900 similar to that shown in FIG. 6A, where like features are referenced by like reference numbers. Instead of being controlled by the bottom chip 601A or an external device, the thermoelectric element 603A is controlled by an adjacent chip (e.g., 6001A or 6002A) via an electrical pathway 909 (e.g., a trace) through the bottom chip 601A.

Figure 10:
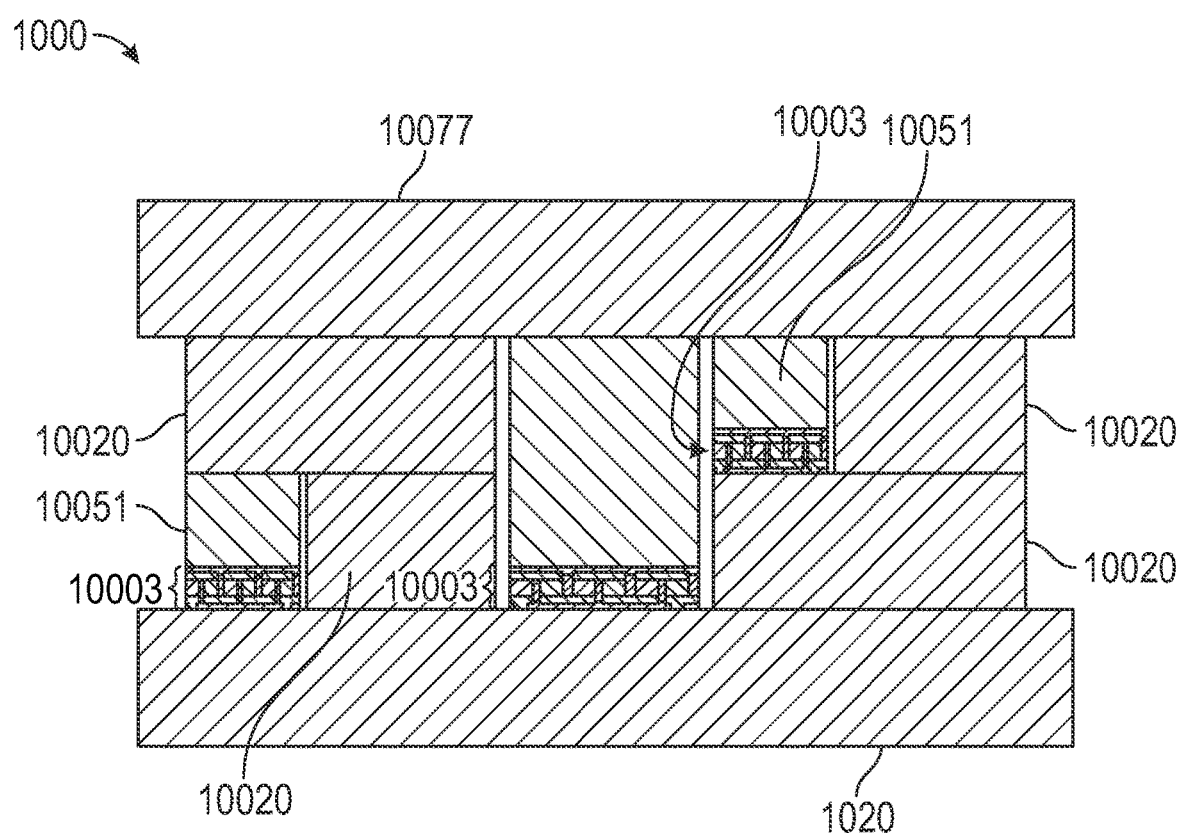
FIG. 10 schematically illustrates a cross-sectional view of yet another example microelectronic system.

FIG. 10 schematically illustrates a cross-sectional view of an example microelectronic system 1000 having stacked semiconductor elements (e.g., active dies 10020 and 1020 and carrier elements 10051) and multiple thermoelectric elements 10003 which can be used to actively redirect heat within and out of the system 1000 (e.g., through a heat sink 10077 at the top of the stack).

In some embodiments, the thermoelectric element 603A, 603B or 10003 may be grown on an carrier (e.g., 605 or 10051) or active chip (e.g., 601A, 601B, 10020 or 1020). In some embodiments, the thermoelectric element 603A, 603B or 10003 may be grown on or directly bonded to the backside of an active chip (e.g., 601A, 601B, 10020 or 1020). In some embodiments, the stacked semiconductor elements can be directly bonded to each other without an intervening adhesive. For example, 6001A, 6001B, 6002A, 6002B and/or 10020 may be directly bonded to the bottom chip (e.g., 601A, 601B or 1020) or to the thermoelectric element 603B. In some embodiments, the top heat sink 607A, 607B or 10077 may be directly bonded to the semiconductor elements (e.g., 6001A, 6001B, 6002A, 6002B or 10020) and/or the carrier 605 or 10051 associated with the thermoelectric element 603A, 603B or 10003. For example, the direct bonding process may include the ZIBOND® and DBI® processes configured for room temperature, atmospheric pressure direct bonding or the DBI® Ultra process configured for low-temperature hybrid bonding, which are commercially available from Adeia of San Jose, CA. The direct bonds can be between dielectric materials of the bonded elements and can also include conductive materials at or near the bond interface for direct hybrid bonding. The conductive materials at the bonding interface may be bonding pads formed in or over a redistribution layer (RDL) over a die, and/or passive electronic components.

Electronic Elements

A die can refer to any suitable type of integrated device die. For example, the integrated device dies can comprise an electronic component such as an integrated circuit (such as a processor die, a controller die, or a memory die), a microelectromechanical systems (MEMS) die, an optical device, or any other suitable type of device die. In some embodiments, the electronic component can comprise a passive device such as a capacitor, inductor, or other surface-mounted device. Circuitry (such as active components like transistors) can be patterned at or near active surface(s) of the die in various embodiments. The active surface may be on a side of the die which is opposite the backside of the die. The backside may or may not include any active circuitry or passive devices.

An integrated device die can comprise a bonding surface and a back surface opposite the bonding surface. The bonding surface can have a plurality of conductive bond pads including a conductive bond pad, and a non-conductive material proximate to the conductive bond pad. In some embodiments, the conductive bond pads of the integrated device die can be directly bonded to the corresponding conductive pads of the substrate or wafer without an intervening adhesive, and the non-conductive material of the integrated device die can be directly bonded to a portion of the corresponding non-conductive material of the substrate or wafer without an intervening adhesive. Directly bonding without an adhesive is described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Examples of Direct Bonding Methods and Directly Bonded Structures

Various embodiments disclosed herein relate to directly bonded structures in which two elements can be directly bonded to one another without an intervening adhesive. Two or more electronic elements, which can be semiconductor elements (such as integrated device dies, wafers, etc.), may be stacked on or bonded to one another to form a bonded structure. Conductive contact pads of one element may be electrically connected to corresponding conductive contact pads of another element. Any suitable number of elements can be stacked in the bonded structure. The contact pads may comprise metallic pads formed in a nonconductive bonding region, and may be connected to underlying metallization, such as a redistribution layer (RDL).

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric materials for direct bonding include but are not limited to inorganic dielectrics, such as silicon oxide, silicon nitride, or silicon oxynitride, or can include carbon, such as silicon carbide, silicon oxycarbonitride, silicon carbonitride or diamond-like carbon. In some embodiments, the dielectric materials do not comprise polymer materials, such as epoxy, resin or molding materials.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid direct bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments in the bonding tool described herein and, subsequently, the bonded structure can be annealed. Annealing can be performed in a separate apparatus. Upon annealing, the contact pads can expand and contact one another to form a metal-to-metal direct bond. Beneficially, the use of hybrid bonding techniques, such as Direct Bond Interconnect, or DBI®, available commercially from Adeia of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 5 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. In embodiments described herein, whether a die or a substrate, the first element can be considered a host substrate and is mounted on a support in the bonding tool to receive the second element from a pick-and-place or robotic end effector. The second element of the illustrated embodiments comprises a die. In other arrangements, the second element can comprise a carrier or a flat panel or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness. For example, the bonding layers may have a surface roughness of less than 2 nm root mean square (RMS) per micron, or less than 1 nm RMS per micron.

In various embodiments, metal-to-metal bonds between the contact pads in direct hybrid bonded structures can be joined such that conductive features grains, for example copper grains on the conductive features grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

In one aspect, the disclosed technology relates to a microelectronic device comprising: a first integrated device die; a thermoelectric element bonded to the first integrated device die; and a heat sink disposed over at least the thermoelectric element, wherein the thermoelectric element is configured to transfer heat from the first integrated device die to the heat sink, the thermoelectric element directly bonded to the first integrated device die without an adhesive.

In one embodiment, the first integrated device die comprises active circuitry.

In one embodiment, the thermoelectric element is directly bonded to the backside of the first integrated device die.

In one embodiment, the interface between the first integrated device die and the thermoelectric element comprises conductor-to-conductor direct bonds.

In one embodiment, the interface between the first integrated device die and the thermoelectric element further comprises non-conductor to non-conductor direct bonds.

In one embodiment, a carrier element is disposed between the thermoelectric element and the heat sink.

In one embodiment, the carrier element is devoid of active circuitry.

In one embodiment, the carrier element comprises silicon, ceramic, Aluminum, Aluminum Nitride, or Silicon Carbide.

In one embodiment, the carrier element comprises a material having a thermal conductivity greater than 1 W/cm/° C.

In one embodiment, the thermoelectric element is grown on the carrier element by a stenciling or printing process.

In one embodiment, the thermoelectric element is grown into cavities in the carrier element by a sintering process.

In one embodiment, the thermoelectric element is directly bonded to the carrier element without an adhesive.

In one embodiment, the interface between thermoelectric element and the carrier element comprises dielectric-to-dielectric direct bonds.

In one embodiment, heat is transferred from the first integrated device die to the heat sink during operation of the thermoelectric element.

In one embodiment, a second integrated device die is disposed on the thermoelectric element and contacting the heat sink.

In one embodiment, a second integrated device die is disposed on the first integrated device die and adjacent to the thermoelectric element.

In one embodiment, the thermoelectric element is electrically connected with the second integrated device die through the first integrated device die.

In one embodiment, the thermoelectric element is attached to bondwires for connecting to an external electrical power source.

In one embodiment, the thermoelectric element is electrically connected with the first integrated device die by way of metal contacts.

In one embodiment, the thermoelectric element is electrically connected with through-substrate vias in the first integrated device die.

In one embodiment, the thermoelectric element is configured for zoned control of cooling the first integrated device die.

In one embodiment, a plurality of temperature sensors is disposed in the first integrated device die or the thermoelectric element, wherein each temperature sensor is associated with two electrical contacts for actuating a portion of the thermoelectric element.

In one embodiment, the microelectronic device further comprises a plurality of electrical contact pairs, each electrical contact pair independently controlling a portion of the thermoelectric element.

In one embodiment, the thermoelectric element is actuated by the first integrated device die, the thermoelectric element, or an external chip.

In another aspect, the disclosed technology relates to a microelectronic device comprising: a first integrated device die; a thermoelectric element formed on the first integrated device die; and a heat sink disposed over at least the thermoelectric element, wherein the thermoelectric element is configured to transfer heat from the first integrated device die to the heat sink.

In one embodiment, the thermoelectric element is grown on the first integrated device die.

In one embodiment, the thermoelectric element is deposited on the first integrated device die.

In one embodiment, the first integrated device die comprises active circuitry.

In one embodiment, the thermoelectric element is grown on the backside of the first integrated device die.

In one embodiment, the thermoelectric element is grown on the first integrated device die by a stenciling or printing process.

In one embodiment, heat is transferred from the first integrated device die to the heat sink during operation of the thermoelectric element.

In one embodiment, a second integrated device die is disposed on the thermoelectric element and contacting the heat sink.

In one embodiment, a second integrated device die is disposed on the first integrated device die and adjacent to the thermoelectric element.

In one embodiment, the thermoelectric element is electrically connected with the second integrated device die through the first integrated device die.

In one embodiment, the thermoelectric element is attached to bondwires for connecting to an external electrical power source.

In one embodiment, the thermoelectric element is electrically connected with the first integrated device die by way of metal contacts.

In one embodiment, the thermoelectric element is electrically connected with through-substrate vias in the first integrated device die.

In one embodiment, the thermoelectric element is configured for zoned control of cooling the first integrated device die.

In one embodiment, a plurality of temperature sensors is disposed in the first integrated device die or the thermoelectric element, wherein each temperature sensor is associated with two electrical contacts for actuating a portion of the thermoelectric element.

In one embodiment, the microelectronic device further comprises a plurality of electrical contact pairs, each electrical contact pair independently controlling a portion of the thermoelectric element.

In one embodiment, the thermoelectric element is actuated by the first integrated device die, the thermoelectric element, or an external chip.

In another aspect, the disclosed technology relates to a microelectronic device comprising: a first integrated device die; a thermoelectric element disposed on the first integrated device die; and a carrier element disposed on the thermoelectric element, wherein the thermoelectric element is configured for zoned control of cooling the first integrated device die.

In one embodiment, the first integrated device die comprises a plurality of zones, and wherein at least one of the zones is activated by a temperature trigger, the temperature trigger received from a thermal sensor.

In one embodiment, the thermal sensor is disposed in the first integrated device die or the thermoelectric element.

In one embodiment, the carrier element is devoid of active circuitry.

In one embodiment, the thermoelectric element is grown on the backside of the first integrated device die by a stenciling or printing process.

In one embodiment, the thermoelectric element is directly bonded to the backside of the first integrated device die.

In another aspect, the disclosed technology relates to a microelectronic device comprising: a first integrated device die; a thermoelectric element disposed on the first integrated device die; a carrier element disposed on the thermoelectric element; and a heat sink disposed over at least the carrier element, wherein the thermoelectric element is configured to transfer heat from the first integrated device die to the heat sink.

In one embodiment, the carrier element is devoid of active circuitry.

In one embodiment, the microelectronic device comprises an additional carrier element disposed between the first integrated device die and the thermoelectric element.

In one embodiment, the first integrated device die comprises active circuitry, and wherein the thermoelectric element is grown on the backside of the first integrated device die by a stenciling or printing process.

In one embodiment, the first integrated device die comprises active circuitry, and wherein the thermoelectric element is directly bonded to the backside of the first integrated device die.

In one embodiment, the carrier element comprises silicon or ceramic.

In one embodiment, the thermoelectric element is grown on the carrier element by a stenciling or printing process.

In one embodiment, the thermoelectric element is grown into cavities in the carrier element by a sintering process.

In one embodiment, the thermoelectric element is directly bonded to the carrier element without an adhesive.

In one embodiment, heat is transferred from the first integrated device die to the heat sink through the carrier element during operation of the thermoelectric element.

In one embodiment, a second integrated device die is disposed on the thermoelectric element and contacting the heat sink.

In one embodiment, a second integrated device die is disposed on the first integrated device die and adjacent to the thermoelectric element.

In one embodiment, the thermoelectric element is electrically connected with the second integrated device die through the first integrated device die.

In one embodiment, the thermoelectric element is attached to bondwires for connecting to an external electrical power source.

In one embodiment, the thermoelectric element is electrically connected with the first integrated device die by way of metal contacts.

In one embodiment, the thermoelectric element is electrically connected with through-substrate vias in the first integrated device die.

In one embodiment, a plurality of temperature sensors is disposed in the thermoelectric element, wherein each temperature sensor is associated with two electrical contacts for actuating a portion of the thermoelectric element.

In one embodiment, the microelectronic device further comprises a plurality of electrical contact pairs, each electrical contact pair independently controlling a portion of the thermoelectric element.

In another aspect, the disclosed technology relates to a microelectronic device configured for direct bonding, comprising: a carrier element, the carrier element devoid of active circuitry; and a thermoelectric element grown on the carrier element by a stenciling or printing process, the thermoelectric element comprising a surface configured for direct hybrid bonding.

In another aspect, the disclosed technology relates to a microelectronic device configured for direct bonding, comprising: a carrier element, the carrier element devoid of active circuitry; and a thermoelectric element grown into cavities in the carrier element by a sintering process, the thermoelectric element comprising a surface configured for direct hybrid bonding.

In another aspect, the disclosed technology relates to a microelectronic device configured for direct bonding, comprising: a carrier element, the carrier element devoid of active circuitry; and a thermoelectric element, comprising a surface directly bonded to the carrier element without an adhesive and an opposite surface configured for direct hybrid bonding.

In another aspect, the disclosed technology relates to a method for forming a microelectronic device, the method comprising: providing a first integrated device die comprising active circuitry; and growing a thermoelectric element on the backside of the first integrated device die.

In one embodiment, the thermoelectric element is grown on the first integrated device die by a stenciling or printing process.

In one embodiment, the thermoelectric element is electrically connected with the first integrated device die by way of metal contacts.

In another aspect, the disclosed technology relates to a method for forming a microelectronic device, the method comprising: providing a carrier element devoid of active circuitry; growing a thermoelectric element on the carrier element; and preparing a surface of the thermoelectric element for direct hybrid bonding.

In one embodiment, the thermoelectric element is grown on the first integrated device die by a stenciling or printing process.

In one embodiment, the carrier element comprises silicon or ceramic.

A method for forming a microelectronic device, the method comprising: providing a carrier element devoid of active circuitry; forming cavities in the carrier element; growing a thermoelectric element on the carrier element and into the cavities; and preparing a surface of the thermoelectric element for direct hybrid bonding.

In one embodiment, the thermoelectric element is grown by a sintering process.

In one embodiment, the carrier element comprises silicon or ceramic.

In another aspect, the disclosed technology relates to a method for forming a microelectronic device, the method comprising: providing a wafer comprising a thermoelectric element; directly bonding a side of the wafer to a carrier element; thinning the wafer from an opposite side to reveal the thermoelectric element; and preparing a surface of the thermoelectric element for direct hybrid bonding.

In one embodiment, the carrier element is devoid of active circuitry.

In one embodiment, the carrier element comprises silicon or ceramic.

In another aspect, the disclosed technology relates to a microelectronic device comprising: a first integrated device die; a thermoelectric element bonded to the first integrated device die; and a heat sink disposed over at least the thermoelectric element, wherein the thermoelectric element is configured to transfer heat from the first integrated device die to the heat sink, and wherein the thermoelectric element is actuated by the first integrated device die.

In one embodiment, the thermoelectric element is directly bonded to the first integrated device die without an adhesive.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A microelectronic device comprising:
a first integrated device die;
a thermoelectric element bonded to the first integrated device die; and
a heat sink disposed over at least the thermoelectric element,
wherein the thermoelectric element is configured to transfer heat from the first integrated device die to the heat sink, the thermoelectric element directly bonded to the first integrated device die without an adhesive, wherein an interface between the first integrated device die and the thermoelectric element comprises non-conductor to non-conductor direct bonds.

2. The microelectronic device of claim 1, wherein the first integrated device die comprises active circuitry.

3. The microelectronic device of claim 2, wherein the thermoelectric element is directly bonded to a backside of the first integrated device die.

4. The microelectronic device of claim 1, wherein the interface between the first integrated device die and the thermoelectric element further comprises conductor-to-conductor direct bonds.

5. The microelectronic device of claim 1, further comprising a carrier element disposed between the thermoelectric element and the heat sink.

6. The microelectronic device of claim 1, wherein the heat is transferred from the first integrated device die to the heat sink during operation of the thermoelectric element.

7. The microelectronic device of claim 1, wherein the thermoelectric element is attached to bondwires for connecting to an external electrical power source.

8. The microelectronic device of claim 1, wherein the thermoelectric element is electrically connected with the first integrated device die by way of metal contacts.

9. The microelectronic device of claim 1, wherein the thermoelectric element is electrically connected with through-substrate vias in the first integrated device die.

10. The microelectronic device of claim 1, wherein the thermoelectric element is configured for zoned control of cooling the first integrated device die.

11. The microelectronic device of claim 10, further comprising a plurality of temperature sensors disposed in the first integrated device die or the thermoelectric element, wherein each temperature sensor is associated with two electrical contacts for actuating a portion of the thermoelectric element.

12. The microelectronic device of claim 10, further comprising a plurality of electrical contact pairs, each electrical contact pair independently controlling a portion of the thermoelectric element.

13. The microelectronic device of claim 10, wherein the thermoelectric element is actuated by the first integrated device die, the thermoelectric element, or an external chip.

* * * * *